US012701336B2

(12) United States Patent
Ma et al.

(10) Patent No.: US 12,701,336 B2
(45) Date of Patent: Aug. 4, 2026

(54) HIGH DYNAMIC RANGE IMAGE SENSOR WITH DUAL-CARRIER PIXEL ARCHITECTURE

(71) Applicant: Apple Inc., Cupertino, CA (US)

(72) Inventors: Jiaju Ma, Arcadia, CA (US); Xin Yue, Monrovia, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 18/664,054

(22) Filed: May 14, 2024

(65) Prior Publication Data

US 2025/0254440 A1 Aug. 7, 2025

Related U.S. Application Data

(60) Provisional application No. 63/549,402, filed on Feb. 2, 2024.

(51) Int. Cl.
H04N 25/571 (2023.01)
H04N 25/78 (2023.01)
H10F 39/00 (2025.01)
H10F 39/18 (2025.01)

(52) U.S. Cl.
CPC ........... H04N 25/573 (2023.01); H04N 25/78 (2023.01); H10F 39/18 (2025.01); H10F 39/807 (2025.01)

(58) Field of Classification Search
CPC .... H04N 25/573; H04N 25/78; H10F 39/807; H10F 39/18
USPC ........................................................ 348/308
See application file for complete search history.

(56) References Cited

U.S. PATENT DOCUMENTS

| | | | |
|---|---|---|---|
| 7,804,537 B2 | 9/2010 | Storm | |
| 9,373,655 B2 | 6/2016 | Imoto | |
| 9,936,153 B1* | 4/2018 | Mao ...................... | H04N 25/77 |
| 10,070,079 B2 | 9/2018 | Hynecek | |
| 11,438,533 B2 | 9/2022 | Yonemoto | |
| 11,582,416 B2 | 2/2023 | Kitano | |
| 2004/0233313 A1* | 11/2004 | Ando ................... | H04N 25/573 |
| | | | 348/E3.018 |

(Continued)

FOREIGN PATENT DOCUMENTS

JP 5985754 B 9/2016

OTHER PUBLICATIONS

Office Action from Japanese Patent Application No. 2025-015957, dated Feb. 26, 2026, pp. 1-19.

*Primary Examiner* — Joel W Fosselman
(74) *Attorney, Agent, or Firm* — Robert C. Kowert; Kowert, Hood, Munyon, Rankin & Goetzel, P.C.

(57) ABSTRACT

A high dynamic range camera device has an image sensor that implements readout circuitry to read out, for individual pixels of the sensor, two values that are based on two different types of charge carriers produced in response to a light exposure. The two readout values are read from two floating diffusion nodes of the pixel photodiode designed to collect the two types of charge carriers (electrons and holes). In embodiments, the first readout value is read out by a first readout circuit that provides linear output with respect to the electrical current generated in the photodiode, and the second readout value is read out by a second readout circuit that provides logarithmic output with respect to the current. The two readout values may be selected or averaged to generate high dynamic range pixel data based on changing light conditions.

20 Claims, 10 Drawing Sheets

(56)          References Cited

U.S. PATENT DOCUMENTS

2014/0263947 A1      9/2014  Dierickx

* cited by examiner

VE Signal
270

Linear Function
310

Electron Current 144

VH Signal
290

Logarithmic Function
320

Hole Current 146

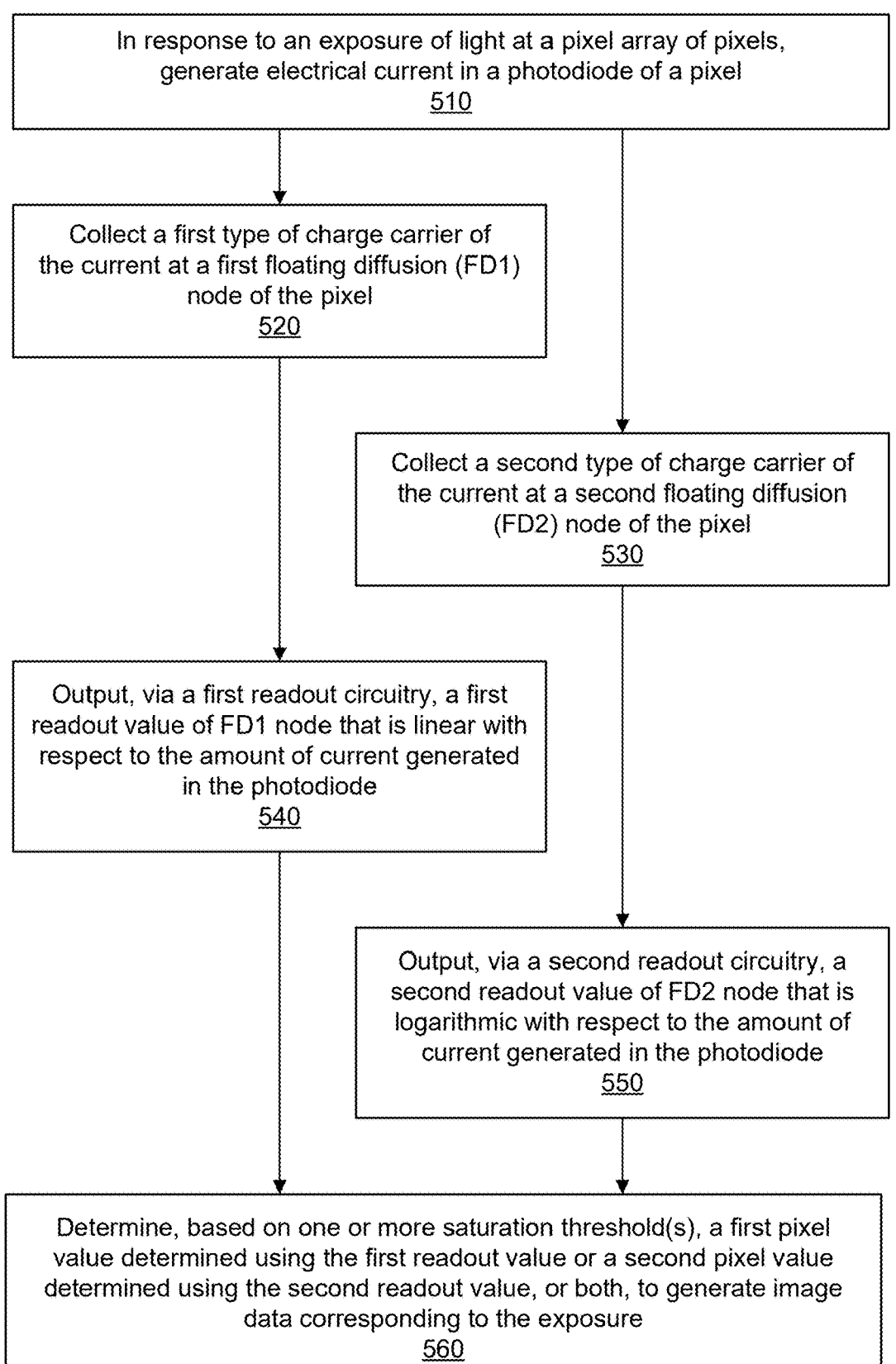

In response to an exposure of light at a pixel array of pixels,
generate electrical current in a photodiode of a pixel
510

Collect a first type of charge carrier of
the current at a first floating diffusion (FD1)
node of the pixel
520

Collect a second type of charge carrier of
the current at a second floating diffusion
(FD2) node of the pixel
530

Output, via a first readout circuitry, a first
readout value of FD1 node that is linear with
respect to the amount of current generated
in the photodiode
540

Output, via a second readout circuitry, a
second readout value of FD2 node that is
logarithmic with respect to the amount of
current generated in the photodiode
550

Determine, based on one or more saturation threshold(s), a first pixel
value determined using the first readout value or a second pixel value
determined using the second readout value, or both, to generate image
data corresponding to the exposure
560

*FIG. 5*

Pixel Calibration Process
600

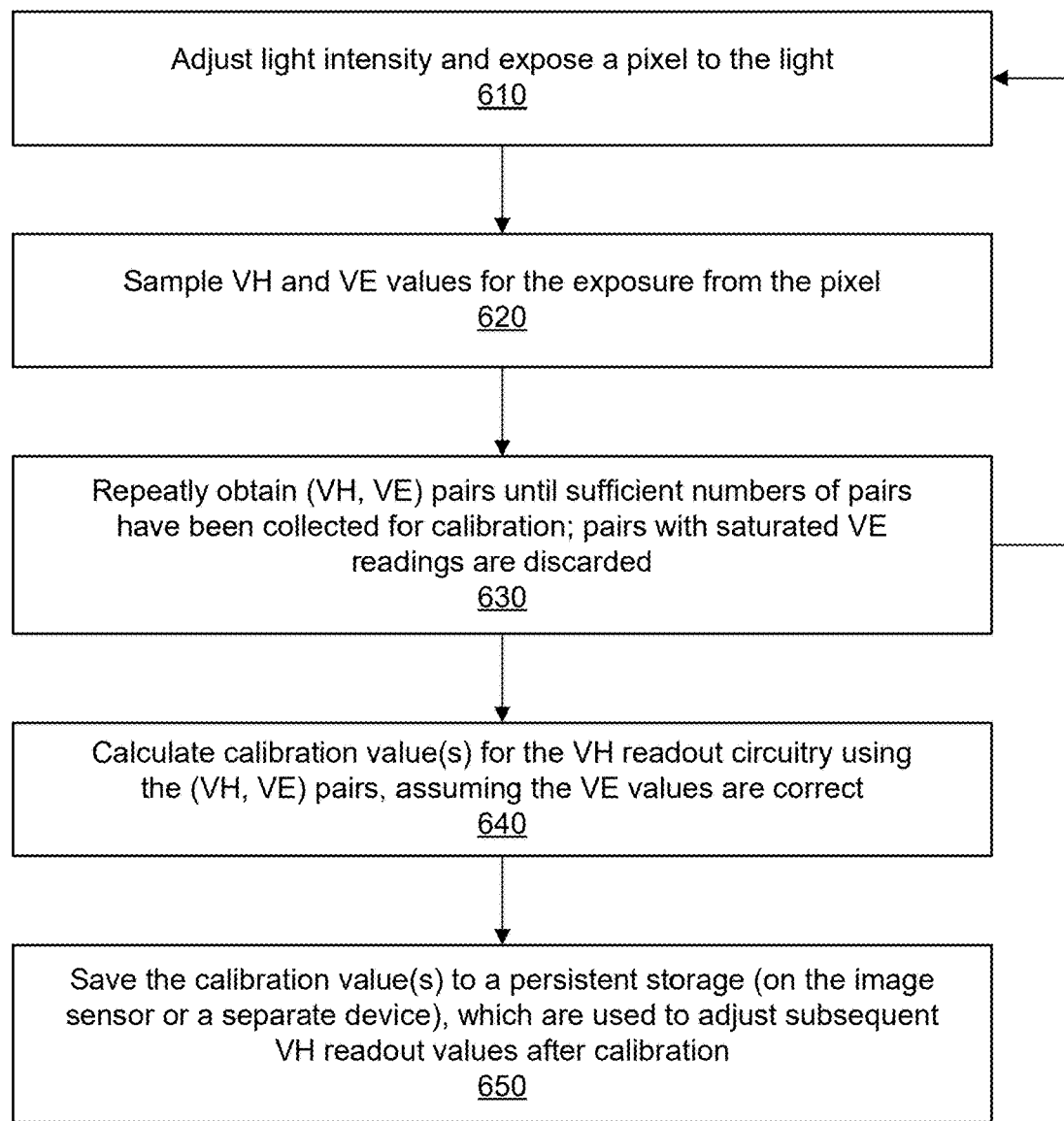

Adjust light intensity and expose a pixel to the light
610

Sample VH and VE values for the exposure from the pixel
620

Repeatly obtain (VH, VE) pairs until sufficient numbers of pairs have been collected for calibration; pairs with saturated VE readings are discarded
630

Calculate calibration value(s) for the VH readout circuitry using the (VH, VE) pairs, assuming the VE values are correct
640

Save the calibration value(s) to a persistent storage (on the image sensor or a separate device), which are used to adjust subsequent VH readout values after calibration
650

*FIG. 6*

HIGH DYNAMIC RANGE IMAGE SENSOR WITH DUAL-CARRIER PIXEL ARCHITECTURE

The present application claims priority to U.S. Provisional App. Nos. 63/549,402, entitled "High Dynamic Range Image Sensor with Dual-Carrier Pixel Architecture," filed Feb. 2, 2024, the disclosure of the above-referenced application is incorporated by reference herein in its entirety.

BACKGROUND

Technical Field

This disclosure herein relates to integrated-circuit image sensors and camera devices employing such image sensors.

Description of Related Art

High dynamic range (HDR) image sensors are used in cameras to capture scenes without saturation even when the scene exhibits a wide range of signal intensities. The dynamic range of the image sensor can be measured by the ratio of pixels' full-well capacity (FWC), meaning the maximum number of carriers a pixel can store without saturation, and the electronic readout noise floor (read noise) of the pixel. In a typical complementary metal-oxide-semiconductor (CMOS) image sensor, the FWC of a pixel is limited by the capacitance of the pinned photodiodes (PPDs) inside the pixel. Higher capacitance enables larger FWC. However, higher capacitance also increases the maximum potential of the PPD, which makes charge transfer more challenging. Therefore, the FWC of a PPD-based pixel is usually limited to thousands of electrons to tens of thousands, depending on the pixel size, which limits the dynamic range to the <100 dB level, assuming the read noise is 1e– or higher. A few pixel and sensor architectures and techniques have been tried to overcome these limitations and achieve higher conversion gain, including multiple exposure with different exposure times, lateral overflow (LOFIC) pixels, multiple conversion gain pixels, etc. However, these techniques are all accompanied by drawbacks, such as slow readout speed, high power consumption, fixed pattern noise (FPN), nonlinearity, among others. New approaches are needed in the field to overcome the limitations of current pixel architectures and to further extend the dynamic range of image sensors with less compromise on other sensor performance.

BRIEF DESCRIPTION OF DRAWINGS

FIG. 5 illustrates a process of using a pixel implemented in a dual-carrier pixel architecture to generate image data, according to some embodiments.

FIG. 6 illustrates a process of calibrating a pixel implemented in a dual-carrier pixel architecture to generate image data, according to some embodiments.

DETAILED DESCRIPTION

Figure 1:
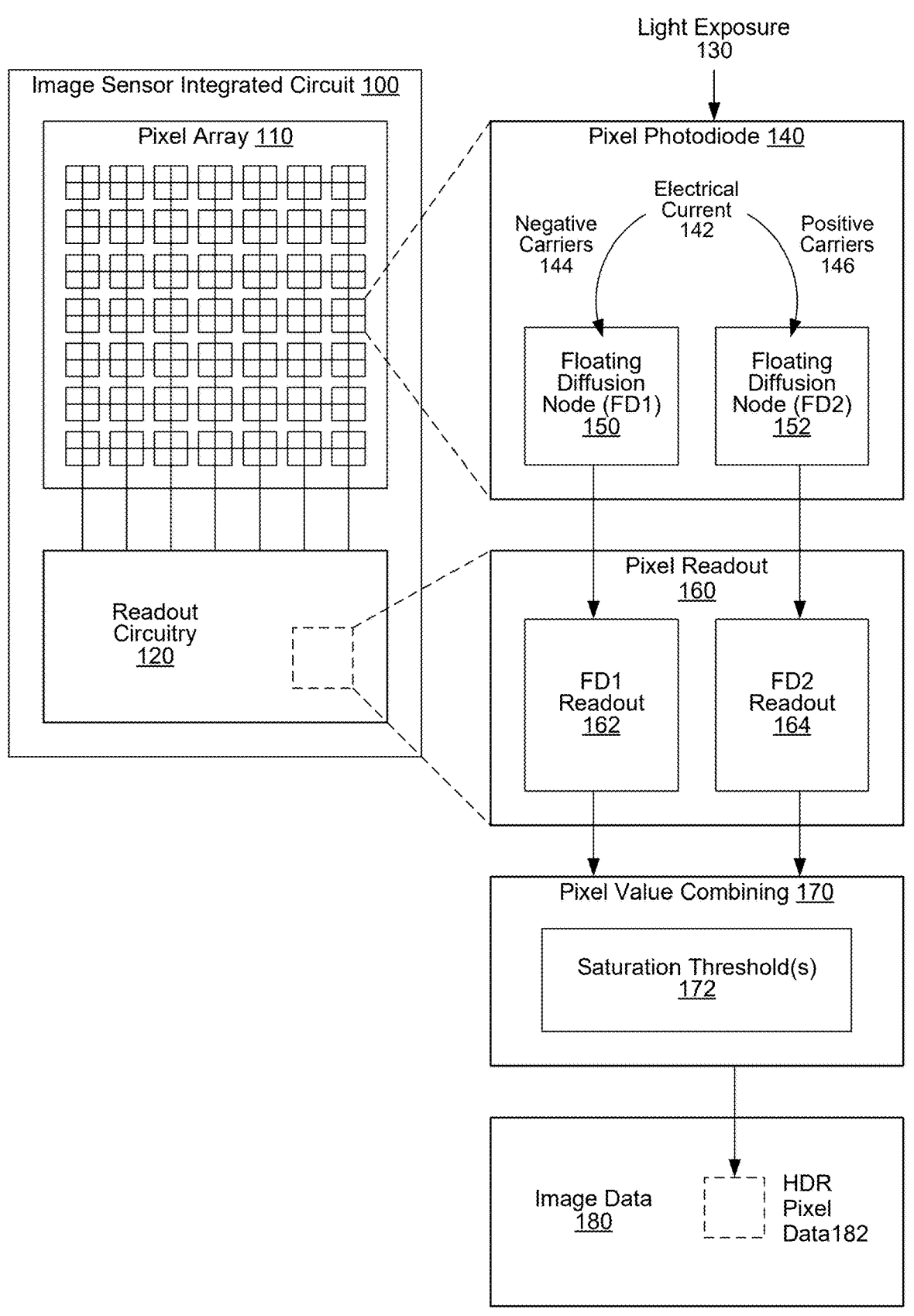
FIG. 1 illustrates an image sensor that implements pixels with a dual-carrier pixel architecture to provide high dynamic range pixel data, according to some embodiments.

To address current challenges in image sensors that support high dynamic range imaging in the state of the art, various embodiments of an image sensor integrated circuit with a dual-carrier pixel architecture are disclosed that enables dual-carrier readout from pixels of the image sensor.

In embodiments of the disclosed pixel architecture, different types of charge carriers generated as the result of a light exposure (e.g. both electrons and holes) are collected by the pixel photodiode. In some embodiments, during integration time of the pixel, electrons are collected by an n-type doping well (NW) inside the pixel substrate and holes are collected by a p-type doping well (PW) inside the pixel substrate. Both NW and PW in the substrate may be floating during integration time so that the photon-generated carriers create voltage signals on the two floating diffusion nodes (e.g., NW as FD1 and PW as FD2). In some embodiments, the electrons collected in FD1 are read out with a linear readout architecture with low read noise, low FPN, and high linearity, but with limited full-well capacity. On the other hand, the holes in FD2 are read out with a logarithmic readout architecture to extend the FWC of the pixel by efficiently compressing the signal and delay pixel saturation, but with relatively high read noise. Depending on the embodiment, the linear/logarithmic readout of the electrons/holes may be interchanged, so that linear output is generated for the holes while logarithmic output is generated for the electrons.

In some embodiments, the substrates of the pixels of the image sensor are electrically isolated from one another using full-size deep trench isolation (FTDI). The sidewall interface of the FDTI may be passivated with a bias voltage or high-k material with a fixed charge, in order to promote the flow of hole carriers to PW or FD2. In some embodiments, the FD2 node may be composed of a heavily p-doped material, so that it can collect hole carriers in a electric field.

In some embodiments, the logarithmic readout circuitry does not employ a transfer gate. In some embodiments, the logarithmic readout circuitry implements a reset transistor that allows a leakage current from the floating diffusion node (which acts as a capacitor for the collected charge carriers in FD2). The leakage current is used to measure the voltage of FD2. The reset transistor can discharge FD2 by pulling the node to a ground voltage, to prepare the node for the next integration in response to light exposure.

In some embodiments, the readout circuitry may require a static substrate bias voltage to be applied, which is not compatible with the operations of the floating diffusion nodes FD1 and FD2. Thus, in some embodiments, the pixel readout circuitry may be implemented on a separate substrate from the PPD substrate. The two substrates may be metal-bonded (e.g. with face-to-face bonding) after fabrication.

The two output values read out from the pixel are eventually combined (e.g. selected or merged) to create per-pixel high dynamic range output. In some embodiments, the electron signal (VE) output is used for low-illumination signal range while hole signal (VH) output is used for high-illumination signal range. The combining may be performed on the image sensor integrated circuit or by a separate device such as a separate image signal processor. In some embodiments, the logarithmic pixel value is used if the linear pixel value is deemed saturated (e.g. when the measured intensity of the exposure exceeds a saturation threshold). In some embodiments, the saturation threshold may be different for different pixels in the pixel array. In some embodiments, multiple thresholds may be used to implement several saturation tiers or ranges, and the two pixel values are combined differently depending on the saturation tier or range (e.g. by adjusting relative weights of the two values in an averaging of the two values).

The disclosed dual-carrier pixel architecture achieves a number of technical advantages over current image sensors of the state of the art. First, the architecture enables HDR pixel output, providing low-noise output for low-light conditions while extending the range of the sensor for high-light conditions. Second, the disclosed architecture only requires a single exposure to generate the two readout values, so that faster readout times and sensor frame rates can be achieved. Third, the disclosed architecture does not require added power to extend the FWC of pixels, which reduces the overall power requirement of the device and reduces issues such as output nonlinearity caused by high power. Additionally, the disclosed architecture does not employ overly complex readout circuitry (such as additional transfer gates used in lateral overflow pixel architectures), which further reduces readout time and power consumption and mitigates other performance issues associated with these conventional pixel architectures. These advantages and features of the disclosed dual-carrier pixel architecture are discussed in further detail below, in connection with the figures.

FIG. 1 illustrates an image sensor 100 that implements pixels with a dual-carrier pixel architecture to provide high dynamic range pixel data 182, according to some embodiments.

As shown, the figure depicts an image sensor integrated circuit 100 that implements a pixel array 100, which includes pixels that can detect light. The pixels generate electrical signals in response to the detected light, which are read out from the pixel array 110 via readout circuitry 120. Each pixel in the pixel array 100 includes a photodetection element such as a photodiode 140. The light exposure 130 causes the photodiode 140 to generate an electrical current 142, which is characterized by a flow of both negative charge carriers 144 (electrons) and positive charge carriers 146 (holes) within the photodiode. As shown, both types of carriers 144 and 146 are collected by the photodiode, here in two floating diffusion nodes FD1 150 and FD2 152. In this example, the negative carriers are collected by FD1, and the positive carriers are collected by FD2. The two floating diffusion nodes FD1 and FD2 may be designed to collect the charge carriers during integration time without an external bias voltage or in an electric field.

As shown, the electrical states of the floating diffusion nodes FD1 and FD2 are then read out by a pixel readout circuitry 160, which includes a FD1 readout circuitry 162 and a FD2 readout circuitry 164. The output of the readout circuitry 162 and 164 may be a voltage reading that corresponds to the amount of accumulated charge carriers in the floating diffusion nodes FD1 and FD2. One of the two readout circuits (e.g. FD1 readout 162) will implement a linear readout that produces an output value that is linear with respect to the amount the electrical current generated by the exposure, while the other readout circuit (e.g. FD2 readout 164) will implement a logarithmic readout that produces an output value that is logarithmic with respect to the amount of electrical current generated by the exposure.

The two readout values produced by the two readout circuits 162 and 164 are then provided to a pixel value combining component 170, which combines the two values based on a comparison of the exposure 130 intensity and one or more saturation thresholds 172. In some embodiments, the pixel value combiner 170 may simply select one of the readout values for use to generate image data 180. For example, the logarithmic output value may be used when the light exposure 130 saturates the floating diffusion node associated with the linear output value (e.g. when the exposure intensity exceeds the saturation threshold 172). In some embodiments, the two pixel values may be averaged based on the saturation level of the exposure. The averaging may be a weighted average using relative weights for the two pixel values. In some embodiments, multiple saturation thresholds 170 may be used to define several saturation tiers or ranges, and the combiner component 170 may adjust the weights of the two values based on the saturation tier or range determined for the exposure 130. For example, when the exposure intensity reaches the next saturation tier, the linear value will be weighed less and the logarithmic value will be weighed more. In some embodiments, the saturation thresholds 172 may be different for different pixels in the pixel array 110, which may be determined based on an initial calibration process. The result of the combiner component 170 is ultimately used to generate HDR pixel data 182 for the pixel in the image data 180 of a scene captured by the image sensor 100.

In some embodiments, the pixel value combining component 170 may be implemented as part of the image sensor integrated circuit 100, either as part of the pixel readout circuitry 160 or an on-sensor digital block, so that the image sensor outputs just one output value per pixel. In other embodiments, the pixel value combining component 170 may be located outside of the image sensor integrated circuit 100, for example on a separate image signal processor.

It is also noted that while the figure shows a single pixel readout circuitry 160 for an individual pixel, in various embodiments, the readout circuitry 160 may be shared by several adjacent pixels in a pixel group. In some such embodiments, the pixel value combiner 170 may perform its function based on readout values of the entire group. For example, in some embodiments, the saturation threshold 172 may be compared against an average exposure intensity observed for the entire group. In some embodiments, the pixel value selection or averaging decision of the combiner 160 may be made for all pixels in the pixel group.

Figure 2:
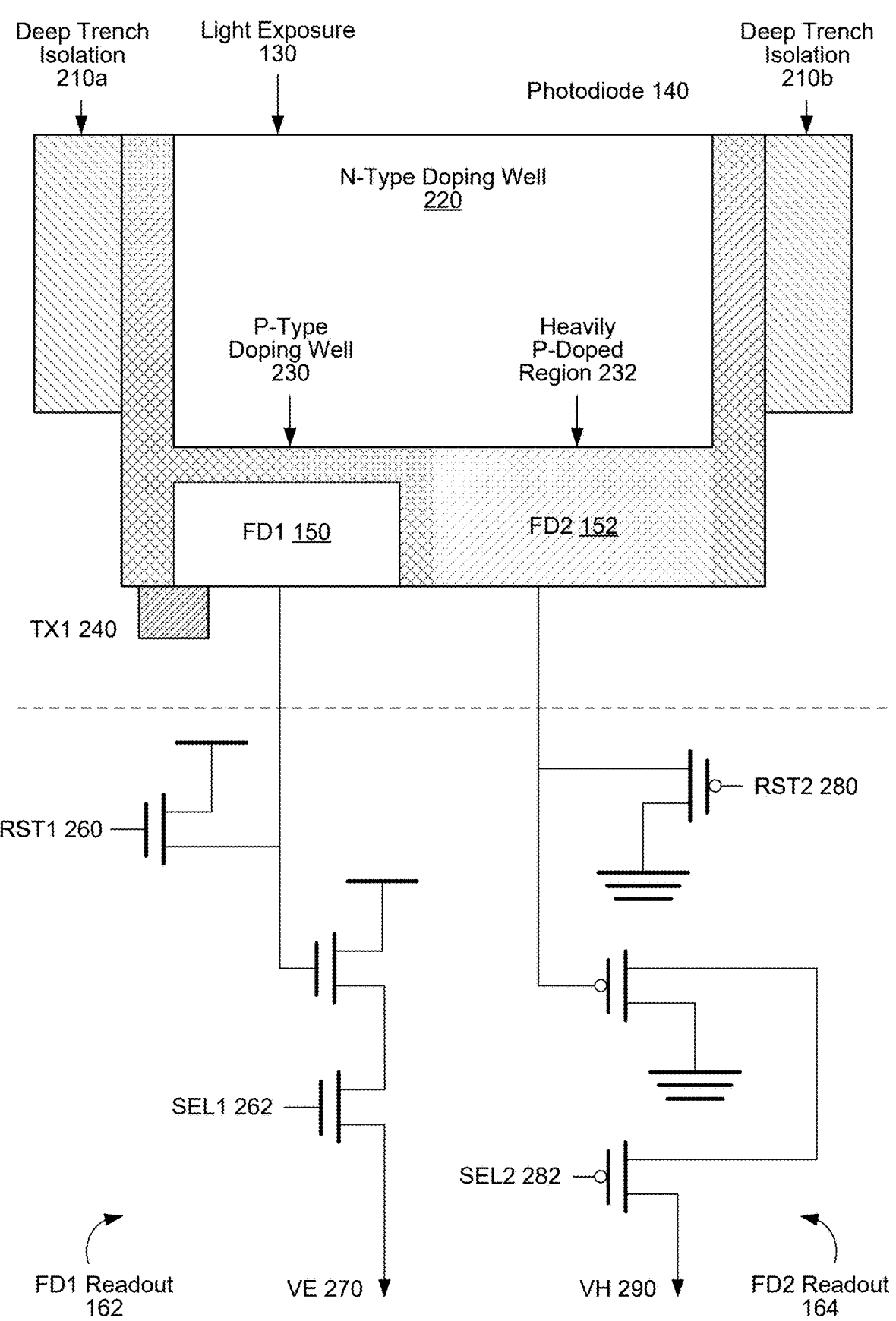
FIG. 2 depicts a cross-sectional view and schematic of a pixel of an image sensor that provides dual-carrier readout, according to some embodiments.

FIG. 2 depicts a cross-sectional view and schematic of a pixel of an image sensor that provides dual-carrier readouts 162 and 164, according to some embodiments.

As shown, the top of the figure depicts a cross section of the photodiode 140. As discussed, the photodiode includes two floating diffusion nodes FD1 150 and FD2 152, which are read out by FD1 readout circuit 162 and FD2 readout circuit 164, respectively, show at the bottom of the figure. In some embodiments, the top and bottom portions of the figure may be implemented on two separate substrates, because the readout circuitry may operate under a substrate bias voltage that is not compatible with the operations of the floating diffusion nodes.

As shown, the photodiode 140 includes an n-type doping well 220 and a p-type doping well 230, which causes the flow of charge carriers in the photodiode in response to the light exposure 130. The FD1 node is implemented as an n-type region surrounded by the p-type doping well 230. FD1 may be gated by a transfer gate TX1 240, which controls the diffusion of electrons into FD1.

As shown, the FD2 node is a heavily p-doped region 232 that is connected to the p-type doping well 230. The p-type doping promotes the flow of positive charge carriers into the region. The FD2 node is configured to collect holes generated by the light exposure during the integration phase, for example, when the photodiode is in a floating or ungrounded state. As discussed, in some embodiments, the FD2 node is capable of collecting holes without application of an external bias voltage. In this example, the collected positive charger carriers form the basis of the logarithmic readout.

As shown, deep trench isolation (DTI) structures 210a and 210b are used to electrically isolate the pixel from other pixels in the pixel array. The pixels may be isolated using full trench deep isolation (FTDI), where the substrates of individual pixels are fully isolated from top to bottom. In some embodiments, the DTI 210 may be polysilicon trenches that can be electrically biased. A negative bias voltage may be applied to a wall interface of the DTI 210 to control the flow of holes into the FD2 node. In some embodiments, the DTI 210 may be used to implement a transfer gate that can be electrically driven to control the flow of carriers into the FD2 node.

As shown, the FD1 readout circuit 162 comprises n-channel metal-oxide-semiconductor (NMOS) logic devices that can conduct electrons. The FD1 readout circuit 162 includes a reset transistor RST1 260 which may be used to discharge the accumulated carriers in the FD1 node. The circuit also includes a selection transistor SEL1 that provides control for timed sampling of the voltage of FD1. The FD1 readout circuit 162 is controllable to generate an output signal VE 270, which is a voltage reading that is linear with respect to magnitude of electrical current that was generated in the photodiode 140 as a result of the light exposure 130.

As shown, the FD2 readout circuit comprises p-channel metal-oxide-semiconductor (PMOS) logic devices that can conduct holes. The FD2 readout circuit 164 includes a reset transistor RST2 280 and a selection transistor SEL2 282. Reset transistor RST2 is controllable to pull the FD2 node to ground voltage to discharge the FD2 node. Moreover, when the FD2 node is holding an accumulated charge, the reset transistor RST2 is configured to allow a leakage current from FD2, which is used to measure the voltage of FD2. This voltage reading, which is VH 290, is logarithmic with respect to the magnitude of electrical current that was generated in the photodiode 140 as a result of the light exposure 130.

Figure 3:
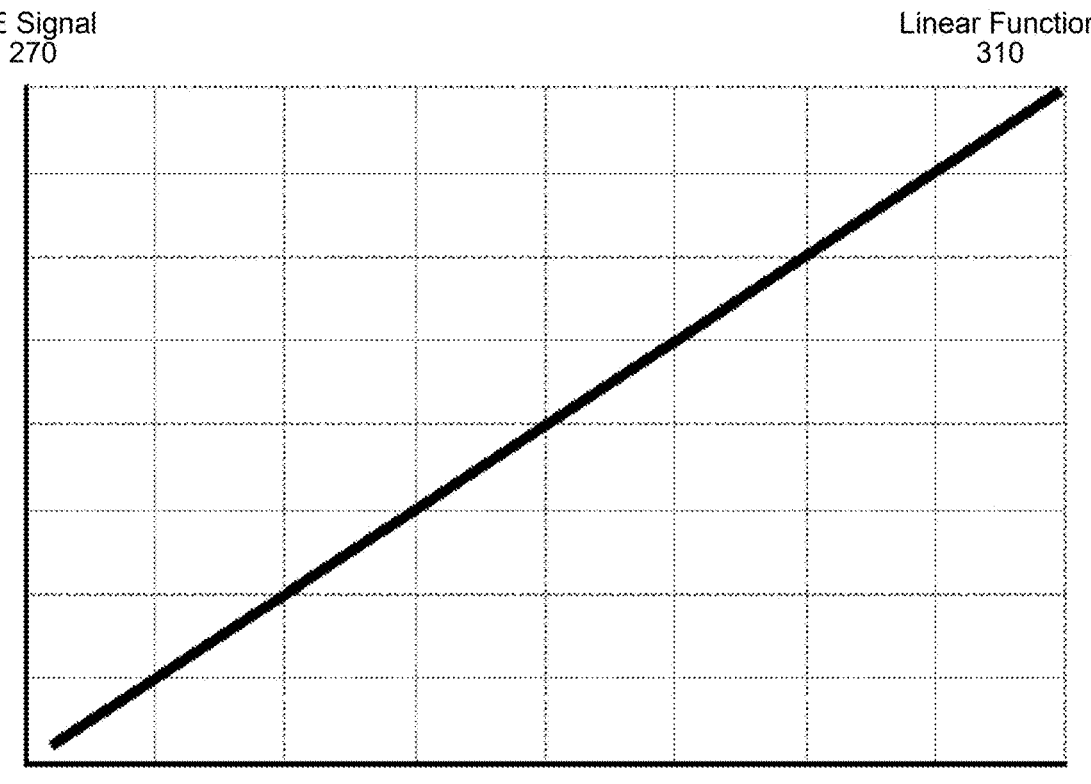
FIG. 3 illustrates signal output of a pixel that provides dual-carrier readout, according to some embodiments.

FIG. 3 illustrates signal output of a pixel that provides dual-carrier readout, according to some embodiments.

The top graph of the figure depicts the VE (electron) signal 270 as a function of the electrical current generated in the photodiode 140. The VE output 270 can be mathematically expressed as:

$$VE = I_{phe} \times T_{int} \times CG \times A_{sf1}$$

where $I_{phe}$ is the photodiode electron current, $T_{int}$ stands for photodiode integration time, CG is the pixel conversion gain, and $A_{sf1}$ is the source follower voltage gain. The gain values CG and $A_{sf1}$ are values that are fixed by the system design. As shown by the equation and the graph, the VE signal 270 is a linear function 310 with respect to the amount of electron current 144 generated in the photodiode.

The bottom graph of the figure depicts the VH (hole) signal 290 as a function of the electrical current generated in the photodiode 140. The VH output 290 can be mathematically expressed as:

$$VH = K \times A_{sf2} \times \ln(I_{phh}/I_0)$$

where $I_{phh}$ is the photodiode hole current, $A_{sf2}$ is the source follower voltage gain, $I_0$ is a leakage current control parameter, and K is a constant. The values K and $I_0$ are process and dimension-dependent parameters of the RST2 NMOS 280. The product $K \times A_{sf2}$ is dependent on the characteristics of the readout circuit and may be calibrated through a calibration process. As shown by the equation and the graph, the VH signal 290 is a logarithmic function 320 with respect to the amount of hole current 146 generated in the photodiode.

Figure 4:
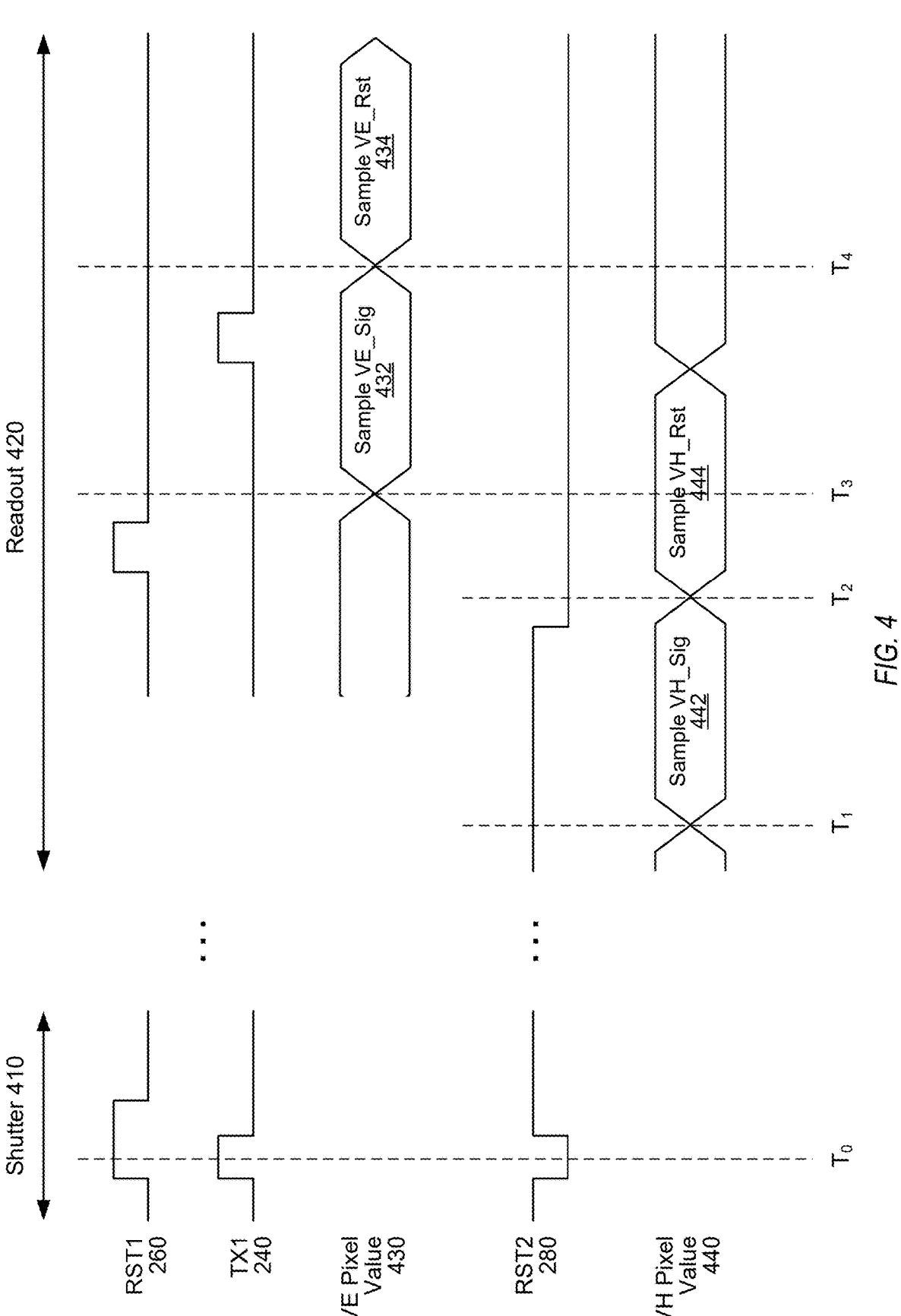
FIG. 4 illustrates a timing diagram of operation of a pixel that provides dual-carrier readout, according to some embodiments.

FIG. 4 illustrates a timing diagram of operation of a pixel that provides dual-carrier readout, according to some embodiments.

As shown, at time $T_0$, a shutter operation 410 is performed on the pixel. During the shutter operation, both the TX1 NMOS 240 and the RST2 PMOS 280 are turned on to clear the accumulated electrons and holes in the pixel. As discussed previously, turning on the RST2 PMOS pulls the FD2 node to a ground voltage.

Following the shutter operation 410, both TX1 and RST2 are turned off to allow the pixel to enter the integration phase, where electrons generated by incident photons will be collected in FD1 and holes generated by incident photos will be collected in FD2. In some embodiments, during the integration phase, both FD1 and FD2 nodes are kept in a floating state. The readout phase 420 begins after the integration phase.

At time $T_1$, the FD2 voltage is sampled to obtain a first signal VH_Sig 442. SEL2 is turned on to enable the sampling. Because of the sub-threshold/leakage current characteristics of the RST2 PMOS, the hole current will be converted into the voltage signal VH at the FD2 node. Subsequently, the RST2 PMOS transistor turns on to pull the FD2 node and substrate of the pixel to a stable ground.

At time $T_2$, the voltage on the FD2 node is sampled once again to obtain a second signal VH_Rst 444, which is used as a reference voltage reading for FD2. The VH pixel value 440 is determined as the voltage difference between the two signals VH_Sig and VH_Rst. In high-light conditions, the voltage difference between VH_Sig and VH_Rst can be logarithmically interpreted as the photo-hole current intensity. Subsequently, the RST1 NMOS transistor turns on and off to reset the FD1 node.

At time $T_3$, the voltage at the FD1 node is sampled to obtain VE_Rst 432 as the reference reading. SEL1 is turned on to enable the sampling. Following this, the TX1 NMOS turns on to enable charge transfer from the photodiode to the FD1 node. At time $T_4$, the FD1 node is sampled once more to obtain VE_Sig 434. The VE pixel value 430 is determined as the voltage difference between the two signals VE_Sig and VE_Rst. In low light conditions, the voltage difference between VE_Rst and VE_Sig can be linearly translated into accumulated electron count per integration time.

Note that in this example, there is no transfer gate used for the hole-side (VH signal) readouts. Thus, FD2 is diffused with holes directly as a result of the light exposure. This transfer gate-less approach may incorporate more readout noise into the output signal, because there is no correlated double sampling to cancel out the noise. However, the design simplifies the readout circuitry, and since the VH pixel value 440 is only used for high-light conditions, a small amount of increased noise may be considered acceptable.

Note also that in other embodiments of the dual-carrier pixel architecture, some variations of the readout process may be implemented. For example, in some embodiments, the VE signal readings may be taken before the VH signal readings. In some embodiments, VH and VE values may be read out together, in parallel. In some embodiments, a saturation evaluation may be made prior to the readout, so that either the VH or VE value will not be sampled, if it is not needed.

FIG. 5 illustrates a process of using a pixel implemented in a dual-carrier pixel architecture (e.g. as shown in FIGS. 1 and 2) to generate image data, according to some embodiments.

The process begins at operation 510, where electrical current is generated in a photodiode of a pixel (e.g. photodiode 140), in response to an exposure of light (e.g. exposure 130). The pixel may be part of a pixel array in an image sensor (e.g. image sensor integrator circuit 100), which is configured to capture successive frames of a scene based on repeated exposures of light.

At operation 520, a first type of charge carrier of the current (e.g. electrons) is collected at a first floating diffusion node (e.g. FD1 150) of the pixel. In some embodiments, the FD1 node may be a negative region in the photodiode surrounded by a p-type doping well (e.g. p-type doping well 230). In some embodiments, the diffusion of FD1 may be controlled by a transfer gate (e.g. TX1 240).

At operation 530, a second type of charge carrier of the current (e.g. holes) is collected at a second floating diffusion node (e.g. FD2 152) of the pixel. In some embodiments, the FD2 node may be a heavily p-doped region (e.g. region 232) in the photodiode that is connected to the p-type doping well, that is more heavily doped than the rest of the p-type doping well. The p-type doping of FD2 causes the follow of holes to the node in response to the light exposure. In some embodiments, the diffusion of FD2 may occur directly as a result of the exposure without being controlled by a transfer gate. In some embodiments, the diffusion of FD2 may occur without external bias. In some embodiments, the diffusion of FD2 may occur when another structure in the photodiode (e.g. DTI 210) is biased. In some embodiments, other structure(s) in the photodiode may be used to implement a transfer gate that controls the diffusion of holes into FD2.

At operation 540, a first readout value of the FD1 node (e.g. VE 270) is output via a first readout circuitry (e.g. FD1 readout 162). The first readout value is linear with respect to the amount of current that is generated in the photodiode, as a result of the light exposure, as discussed in connection with FIG. 3.

At operation 550, a second readout value of the FD2 node (e.g. VH 290) is output via a second readout circuitry (e.g. FD2 readout 164). The second readout value is logarithmic with respect to the amount of current that is generated in the photodiode, as a result of the light exposure, as discussed in connection with FIG. 3. In some embodiments, the logarithmic readout circuit may implement a transistor (e.g. RST2 280) that allows a leakage current from the FD2 node. This leakage current is used to measure the voltage of FD2.

At operation 560, a first pixel value (e.g. VE pixel value 430) is determined using the first readout value and a second pixel value (e.g. VH pixel value 440) is determined using the second readout value. As discussed in connection with FIG. 4, the two pixel values 430 and 440 may be determined from two readouts from each respective readout circuit (e.g. readouts 432 and 434 for VE pixel value 430, and readouts 442 and 444 for VH pixel value 440), and then taking a difference of the two readout values. For the logarithmic readout values, a linearization step may be performed to convert the logarithmic readout signals to a linear signal.

Operation 560 then determines, based on one or more saturation threshold(s) (e.g. thresholds 172), how the two pixel values should be used to generate image data (e.g. HDR pixel data 182) corresponding to the exposure. In some embodiments, the determination may involve a selection of whether to use the first pixel value, the second pixel value, or both, to generate the image data. For example, in some embodiments, the second pixel value (e.g. the logarithmic value) may be used when the exposure exceeds a saturation threshold (e.g. when the pixel observes light in a high-light condition). As another example, the first and second pixel values may be combined to generate the image data, for example using an averaging function. The averaging may employ weights for the two pixel values (e.g. linear weights) that are adjustable based on the saturation level of the pixel (e.g. based on one of several saturation tiers or ranges). The combining function may also implement per-pixel corrections for gain, offset, linearity, etc.

Depending on the embodiment, the saturation threshold(s) may be globally set for all pixels on the pixel array or be different for individual pixels in the pixel array. The saturation thresholds may be determined based on an initial calibration process. Depending on the embodiment, operation 560 may be performed on the image sensor (e.g. as part of the readout circuitry or a downstream digital block), or by a separate device distinct from the image sensor (e.g. on a separate image signal processor).

FIG. 6 illustrates a process 600 of calibrating a pixel implemented in a dual-carrier pixel architecture (e.g. as shown in FIGS. 1 and 2) to generate image data, according to some embodiments.

In some embodiments, because of variations in the electrical characteristics of the logarithmic-side readout circuitry, in particular the RST2 PMOS 280, the output of the readout circuitry will vary from pixel to pixel, which can lead to problems such as FPN. To mitigate such issues, the per-pixel calibration process 600 is used to eliminate (or at least reduce) the readout variations.

During the calibration process, readouts from the two readout circuits are taken for a single exposure. The calibration process assumes that the amount of electron current and hole current generated by the exposure are the same, and that the linear reading correctly reflects the amount of current generated. These assumptions are then used to calculate one or more calibration parameters that harmonizes the logarithmic reading with the linear reading. In some embodiments, the calibration is performed using the equations for VE and VH discussed previously, assuming that $I_{phe}=I_{phh}$ for a test exposure, and that the linear readout value VE is the correct value given $I_{phe}$. Thus, the calculation will first solve for $I_{phe}$ using the VE equation and the observed VE, and then solve for the calibration parameter in the VH equation using the observed VH value and $I_{phh}$, which is the same as $I_{phe}$. In some embodiments, the calibration process uses just two test exposures per pixel to calibrate the parameter $K \times A_{sf2}$ used in the VH equation. In general, the calibration technique may use more than two pairs of (VE, VH) test readings, and can be used to calibrate multiple variables of the VH signal independently.

Turning to the figure, at operation 610, the process adjusts the light intensity for a test exposure and exposes the pixel under testing to the light. At operation 620, a pair VH and VE readout values are sampled for the test exposure, from the pixel. Operation 630 repeats operations 610 and 620 until a sufficient number of test reading pairs (VH, VE) have been collected. Readings pairs with saturated VE readings are discarded, because these readings are not reliable for suitable for calibration purposes. The light intensity for each test exposure may be chosen randomly or using some heuristic to optimize calibration accuracy and/or speed.

At operation 640, one or more calibration values for the VH readout circuit are calculated using the collected (VH, VE) pairs, assuming that the VE readings are correct. As discussed, the calculation may assume that the hole current and the electron current generated by a single exposure are the same, and uses this assumption to calculate the calibration parameter(s) for VH.

At operation 650, the calibration value(s) determined from operation 640 are saved to a persistent storage. These calibration values may be stored on the image sensor itself or on a separate device such as a separate image signal processor. These calibration value(s) are used after the calibration process to adjust or correct subsequent readings from the VH readout circuit.

Figure 7:
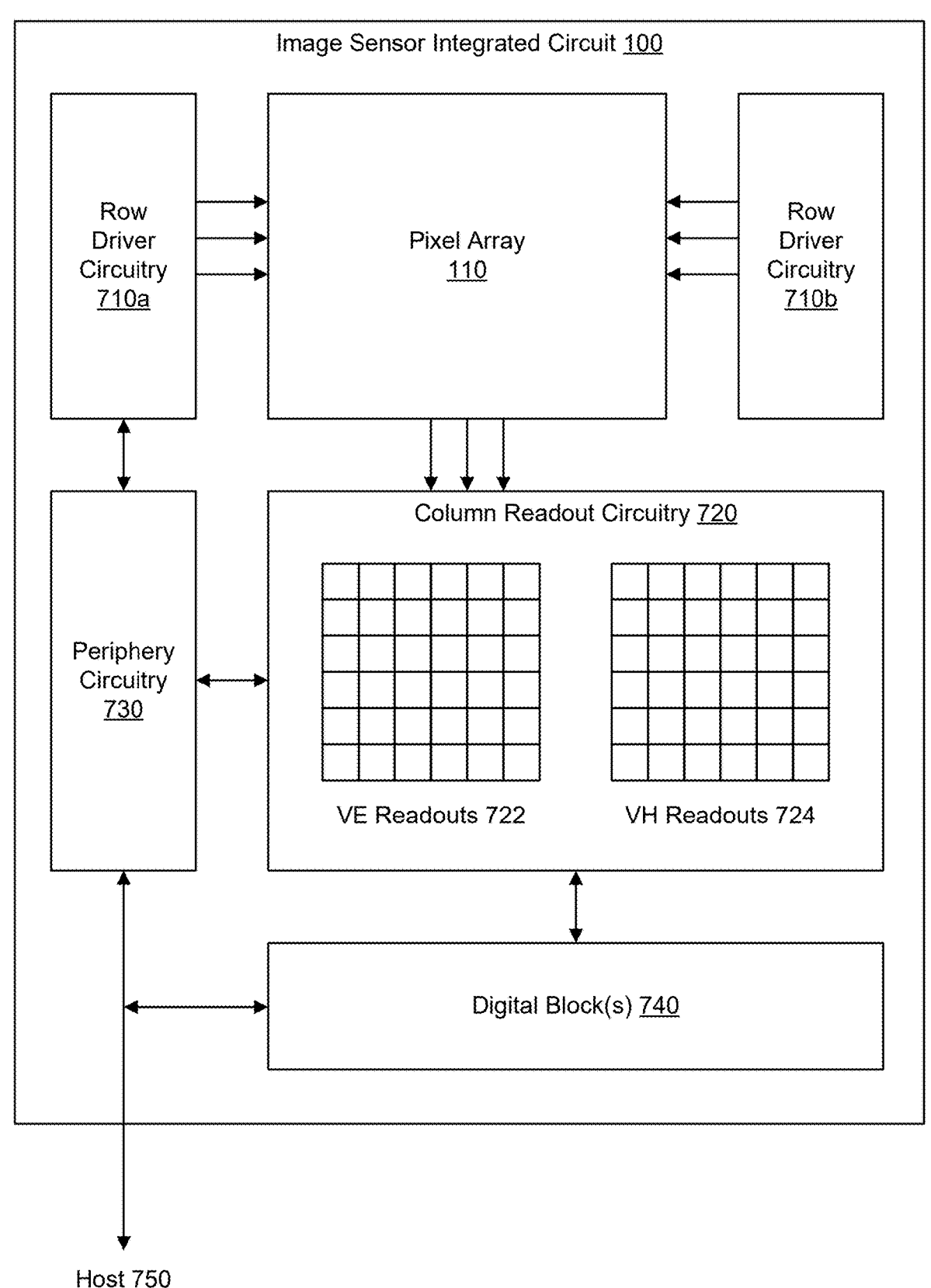
FIG. 7 is a block diagram of an example CMOS image sensor architecture that may be used to implement an image sensor that employs a dual-carrier pixel architecture, according to some embodiments.

FIG. 7 is a block diagram of an example CMOS image sensor architecture that may be used to implement an image sensor 100 that employs a dual-carrier pixel architecture, according to some embodiments.

The pixel array 110 may include a large number of pixels arranged in an M×N array. Individual pixels in the pixel array may be implemented according to the dual-carrier pixel architecture discussed in connection with FIGS. 1 and 2. For example, each pixel in the array may implement two floating diffusion nodes (FD1 and FD2) configured to collect carriers of different types.

The row addressing and row driver circuitry 710 generates readout signals to the pixel array 110, which may include transfer gate (TG) control signals, row select (RS) signals, and reset drain (RD) control signals. In some embodiments, the column readout circuitry 720 may be configured to implement the pixel-wise gain selection described herein, and may include analog-to-digital circuitry for sampling and/or digitizing output values readout from the pixel array 110. Circuitry 720 may be implemented to comprise a plurality of A/D converters configured to implement column parallel readout. In some embodiments, the circuitry 720 may be configured such that the readout circuitry associated with each column bus may have a respective analog to digital converter (ADC), though in some embodiments pairs of columns may share an ADC. As shown, the column readout circuitry 720 in this example implements VE readout circuits 722 and VH readout circuits 724, which implement FD1 readout and FD2 readout circuits for individual pixels or pixel groups in the pixel array 100. As discussed, in some embodiments, the pixel array 110 and the readout circuitry 710 and 720 may be implemented on separate substrates, so that a substrate bias voltage can be applied to the readout substrate without interfering with the operation of the floating diffusion nodes of the pixels.

The periphery circuitry 730 is used to implement functionality separate from the readout circuitry 710 and 720. In some embodiments, periphery circuitry 730 may implement timing and control circuitry used to control both the row addressing and row driver circuitry 710 and the column readout circuitry 720. For instance, timing and control circuitry controls the row addressing and row driver circuitry 710 for selecting the appropriate row for readout, and may, for example, provide timing control signals in accordance with rolling shutter readout or global shutter readout. As shown, timing and control circuitry 730 may also provide communication capabilities to communicate or interface with a host 750 (e.g., a processor associated with a camera system comprising the image sensor), which may, for example, in some implementations, specify various control information.

In some embodiments, signals on column readout buses are sampled and digitized by circuitry in column readout circuitry 720, and the digitized pixel values provided by the ADCs may be provided to line buffers, which may be used to temporarily store digital signals from the column readout circuitry 720 for use by an image processor implemented in the digital block(s) 740. In general, any number of line buffers may be included and, for example, each line buffer may be capable of storing digital signals representative of the charge signals that may be read from each pixel in a given row of pixels in the pixel array 110. The image processor may be used to process the digital signals held in line buffers to produce output image data that may be provided to a device external to the image sensor. In some embodiments, the image process may be implemented on a separate integrated circuit as the image sensor integrated circuit 100.

Figure 8:
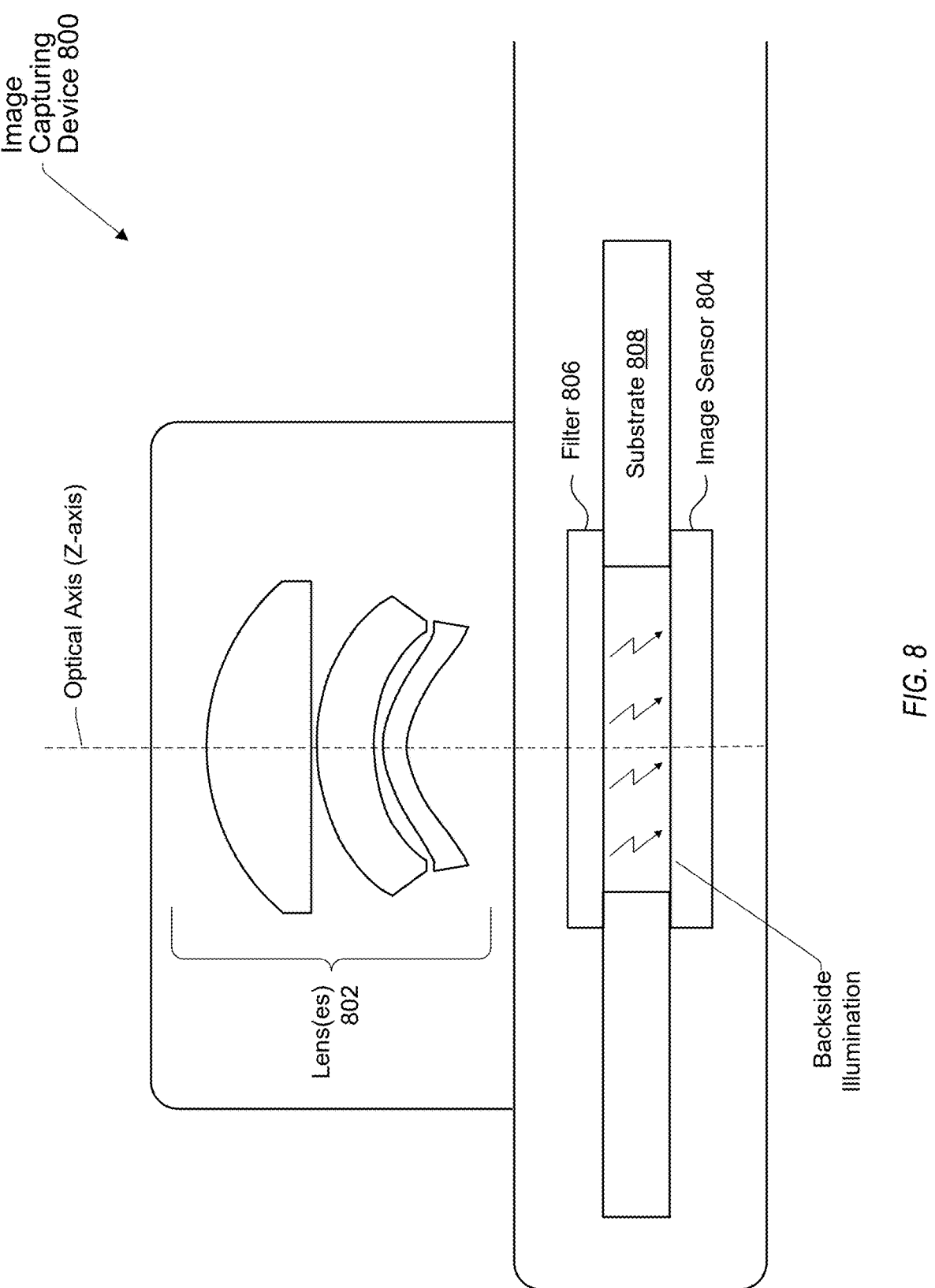
FIG. 8 is a block diagram of an example image capturing device (e.g. a camera) having an image sensor that provides dual-carrier readout, according to some embodiments.

FIG. 8 is a block diagram of an example image capturing device 800 (e.g. a camera device) having an image sensor that provides dual-carrier readout, according to some embodiments.

As shown in FIG. 8, in some embodiments, image capturing device 800 may include one or more lenses 802 and image sensor 804, which is an embodiment of the image sensor 100 discussed previously. In some embodiments, image capturing device 800 may capture light from an environment (e.g. light exposures 130), and the light may pass through lenses 802 to reach image sensor 804. In some embodiments, image sensor 804 may implement a plurality of pixels (e.g. in a pixel array 110), and at least some of the pixels implement the dual-carrier readout architecture as described above. In some embodiments, the image sensor 504 is a CMOS image sensor. In some embodiments, the image capturing device 800 may be a video camera that is capable of capturing successive frames of a scene.

In some embodiments, image capturing device 800 may include a filter 806 (e.g. an infrared cutoff filter) placed between lenses 802 and image sensor 804 to block some of the light from reaching image sensor 804. As shown in this example, image sensor 804 and filter 806 may be mounted on a substrate 808, and the image sensor 804 may be placed upside down so as to receive backside illumination. Alternatively, front side illumination may be implemented on image sensor 804 in some embodiments.

As discussed, the dual-carrier pixel readout architecture described herein enables the camera 800 to capture HDR images, at a relatively higher frame rate and using less power, as compared to camera devices using image sensors that do not use the dual-carrier pixel readout architecture. As will be appreciated by those skilled in the art, the advantages created by the dual-carrier pixel design form the basis for features that are essential drivers of demand for cameras in the marketplace.

Figure 9:
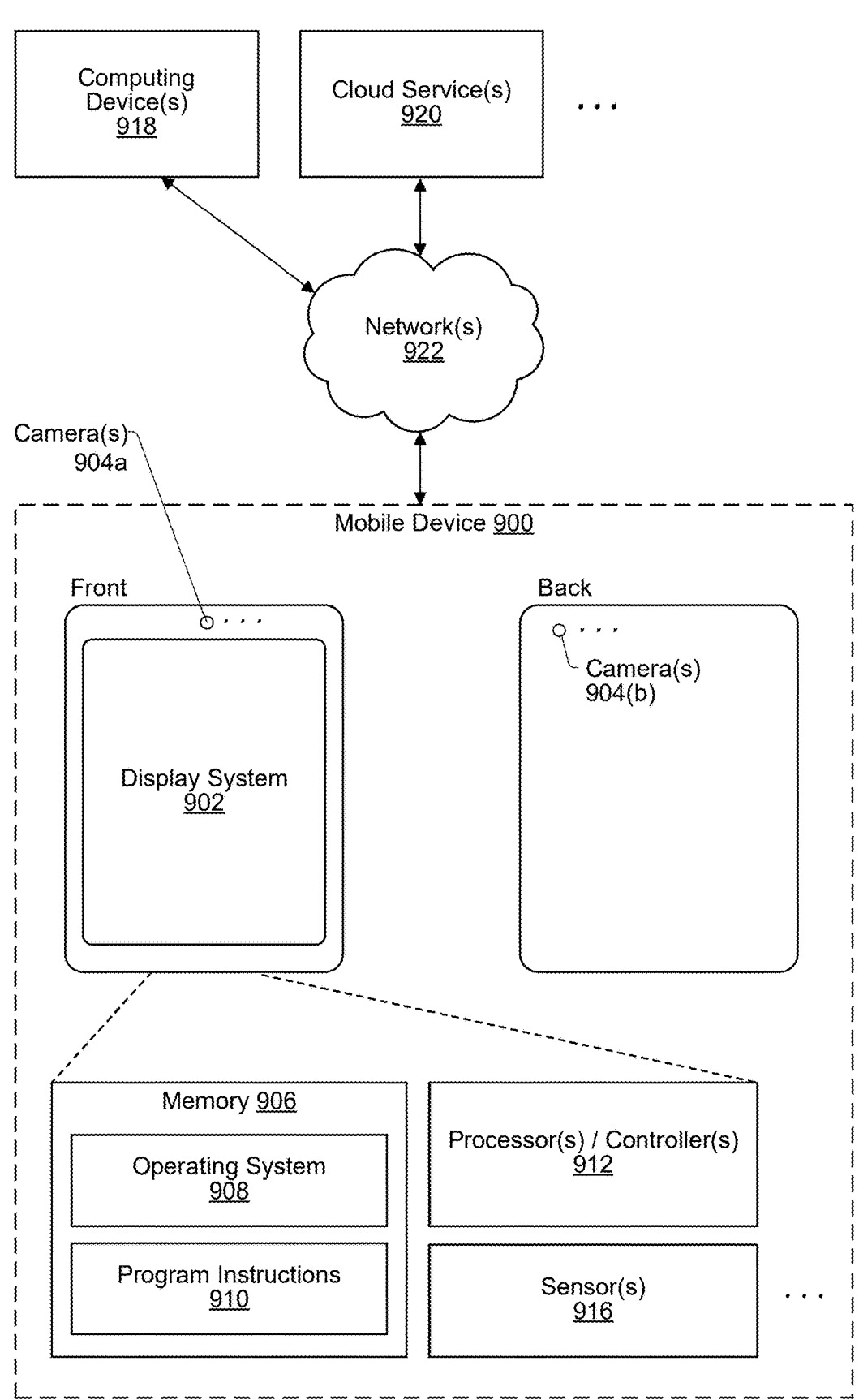
FIG. 9 is a schematic representation of an example mobile device that implements one or more cameras having an image sensor that provides dual-carrier readout, according to some embodiments.

FIG. 9 is a schematic representation of an example mobile device 900 that implements one or more cameras 904 having an image sensor that provides dual-carrier readout, according to some embodiments.

In some embodiments, the mobile device 900 may be a multifunction user device such as a smartphone, personal computer, laptop, notebook, tablet, slate, pad, or netbook computer, handheld computer, digital camera, a video recording device, an augmented reality (AR) and/or virtual reality (VR) headset, handheld video game device, among others. In some embodiments, the mobile device 900 may be battery powered, so that it can operate for a period of time without access of a fixed power source (e.g. a wall power socket). In these types of mobile devices, the voltage output of the battery may decrease over time, so that some powered components of the device will become less performant or inoperable after a period of use without recharging. As discussed, the dual-carrier pixel readout architecture as described herein allows cameras 904 on the mobile device to capture HDR image data using less power. Accordingly, mobile devices that employ the dual-carrier pixel readout architecture can operate for longer without power recharge, or alternatively, employ a smaller battery with less charge capacity. As shown, in some embodiments, the dual-carrier pixel readout architecture allows the mobile device to operate multiple camera devices 904 at the same time. Accordingly, the advantages enabled by the dual-carrier image sensor design as described herein form the basis for features that are essential drivers of demand for these mobile devices in the marketplace.

In some embodiments, the mobile device 900 may include a display system 902 (e.g., comprising a display and/or a touch-sensitive surface) and/or one or more cameras 904. In some non-limiting embodiments, the display system 902 and/or one or more front-facing cameras 804*a* may be provided at a front side of the device 900. Additionally, or alternatively, one or more rear-facing cameras 904*b* may be provided at a rear side of the device 900. In various embodiments, the location(s) and/or arrangement(s) of the camera(s) 904 may be different than those indicated in FIG. 9. Depending on the embodiment, some or all of the cameras 904 may be the same as, or similar to, each other. For example, several of the cameras 904 may implement the dual-carrier pixel readout architecture, as described herein. Some of the cameras 904 may be video cameras configured to capture HDR image data, as discussed in connection with FIG. 8.

Depending on the embodiment, the mobile device 900 may operate a number of powered components, that including, among other things, memory 906 (e.g., comprising an operating system 908 and/or application(s)/program instructions 910), one or more processors and/or controllers 912 (e.g., CPU(s), memory controller(s), display controller(s), and/or camera controller(s), etc.), and/or one or more sensors 916 (e.g., orientation sensor(s), proximity sensor(s), and/or position sensor(s), etc.). In some embodiments, the device 900 may implement network interfaces to communicate with one or more other devices and/or services, such as computing device(s) 918, cloud service(s) 920, etc., via one or more networks 922. For example, the device 900 may include a wireless interface that enables the device 900 to transmit data to and receive data from wireless network(s), using a variety of communications standards, protocols, and/or technologies.

Figure 10:
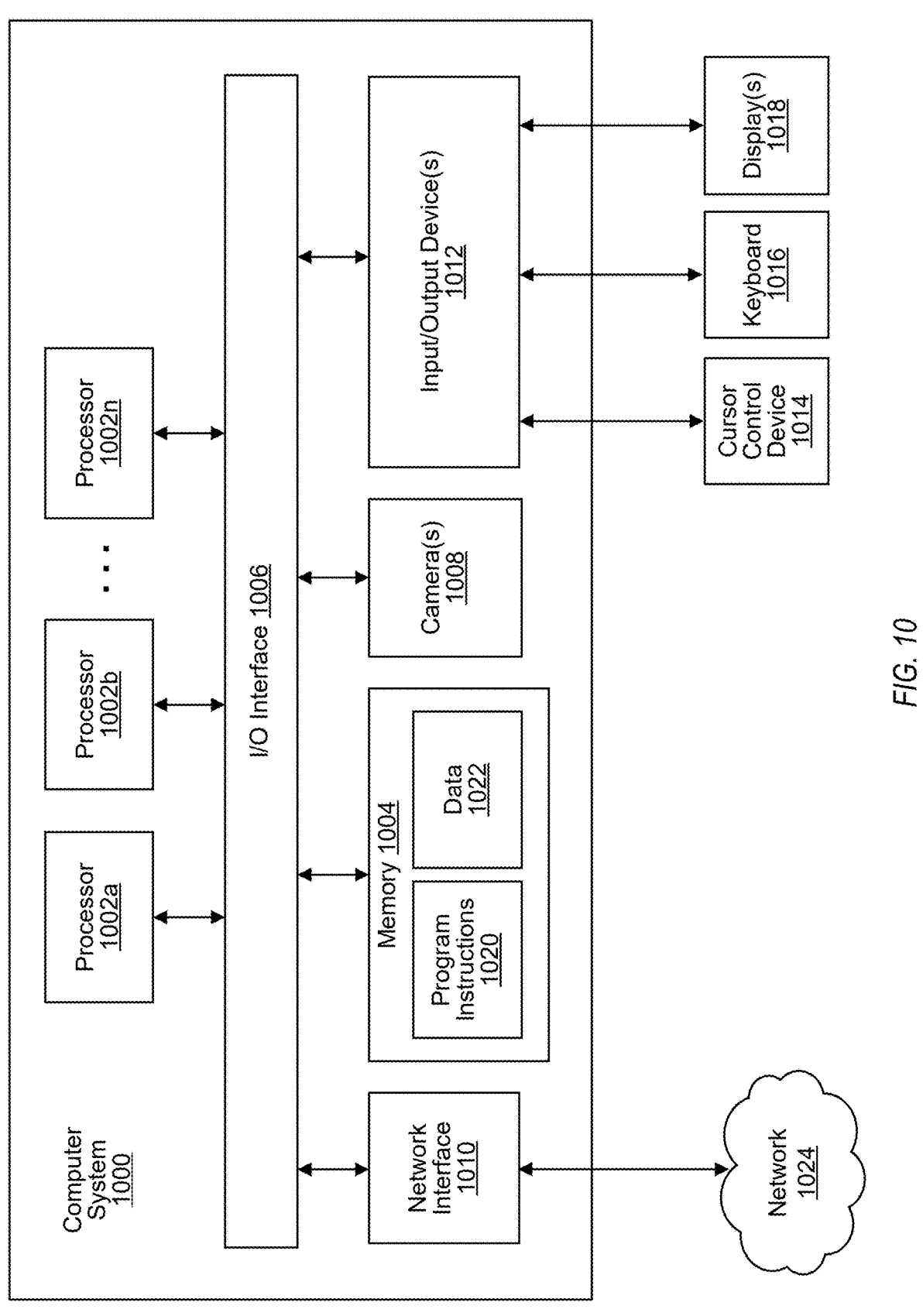
FIG. 10 is a block diagram of an example computing system that includes or hosts an image capturing device (e.g., a camera) having an image sensor that provides dual-carrier readout, according to some embodiments.

FIG. 10 is a block diagram of an example computing system 1000 that includes or hosts an image capturing device (e.g., one or more cameras 1008) having an image sensor that provides dual-carrier readout, according to some embodiments.

The computer system 1000 may implement methods for controlling operations of the camera 1008 and/or for performing image processing images captured with the camera 1008. In some embodiments, the camera device 800 of FIG. 8 or mobile device 900 of FIG. 9 may implement some or all of the functional components of the computer system 1000 described herein. Embodiments of the computer system 1000 may be configured to execute any or all of the embodiments described above.

In various embodiments, the computer system 1000 may be any of various types of devices, including, but not limited to, a personal computer system, desktop computer, laptop, notebook, tablet, slate, pad, or netbook computer, mainframe computer system, handheld computer, workstation, network computer, a camera, a set top box, a mobile device, an augmented reality (AR) and/or virtual reality (VR) headset, a consumer device, video game console, handheld video game device, application server, storage device, a television, a video recording device, a peripheral device such as a switch, modem, router, or in general any type of computing or electronic device.

In the illustrated embodiment, computer system 1000 includes one or more processors 1002 coupled to a system memory 1004 via an input/output (I/O) interface 1006. Computer system 1000 further includes one or more cameras 1008 coupled to the I/O interface 1006. Computer system 1000 further includes a network interface 1010 coupled to I/O interface 1006, and one or more input/output devices 1012, such as cursor control device 1014, keyboard 1016, and display(s) 1018. In some cases, it is contemplated that embodiments may be implemented using a single instance of computer system 1000, while in other embodiments multiple such systems, or multiple nodes making up computer system 1000, may be configured to host different portions or instances of embodiments. For example, in one embodiment some elements may be implemented via one or more nodes of computer system 1000 that are distinct from those nodes implementing other elements.

In various embodiments, computer system 1000 may be a uniprocessor system including one processor 1002, or a multiprocessor system including several processors 1002 (e.g., two, four, eight, or another suitable number). Processors 1002 may be any suitable processor capable of executing instructions. For example, in various embodiments processors 1002 may be general-purpose or embedded processors implementing any of a variety of instruction set architectures (ISAs), such as the x86, PowerPC, SPARC, or MIPS ISAs, or any other suitable ISA. Also, in some embodiments, one or more of processors 1002 may include additional types of processors, such as graphics processing units (GPUs), application specific integrated circuits (ASICs), etc. In multiprocessor systems, each of processors 1002 may commonly, but not necessarily, implement the same ISA. In some embodiments, computer system 1000 may be implemented as a system on a chip (SoC). For example, in some embodiments, processors 1002, memory 1004, I/O interface 1006 (e.g. a fabric), etc. may be implemented in a single SoC comprising multiple components integrated into a single chip. For example, an SoC may include multiple CPU cores, a multi-core GPU, a multi-core neural engine, cache, one or more memories, etc. integrated into a single chip. In some embodiments, an SoC embodiment may implement a reduced instruction set computing (RISC) architecture, or any other suitable architecture.

System memory 1004 may be configured to store program instructions 1020 accessible by processor 1002. In various embodiments, system memory 1004 may be implemented using any suitable memory technology, such as static random-access memory (SRAM), synchronous dynamic RAM (SDRAM), nonvolatile/Flash-type memory, or any other type of memory. Additionally, existing camera control data 1022 of memory 1004 may include any of the information or data structures described above. In some embodiments, program instructions 1020 and/or data 1022 may be received, sent or stored upon different types of computer-accessible media or on similar media separate from system memory 1004 or computer system 1000. In various embodiments, some or all of the functionality described herein may be implemented via such a computer system 1000.

In one embodiment, I/O interface 1006 may be configured to coordinate I/O traffic between processor 1002, system memory 1004, and any peripheral devices in the device, including network interface 1010 or other peripheral interfaces, such as input/output devices 1012. In some embodiments, I/O interface 1006 may perform any necessary protocol, timing or other data transformations to convert data signals from one component (e.g., system memory 1004) into a format suitable for use by another component (e.g., processor 1002). In some embodiments, I/O interface 1006 may include support for devices attached through various types of peripheral buses, such as a variant of the Peripheral Component Interconnect (PCI) bus standard or the Universal Serial Bus (USB) standard, for example. In some embodiments, the function of I/O interface 1006 may be split into two or more separate components, such as a north bridge and a south bridge, for example. Also, in some embodiments some or all of the functionality of I/O interface 1006, such as an interface to system memory 1004, may be incorporated directly into processor 1002.

Network interface 1010 may be configured to allow data to be exchanged between computer system 1000 and other devices attached to a network 1024 (e.g., carrier or agent devices) or between nodes of computer system 1000. Network 1024 may in various embodiments include one or more networks including but not limited to Local Area Networks (LANs) (e.g., an Ethernet or corporate network), Wide Area Networks (WANs) (e.g., the Internet), wireless data networks, some other electronic data network, or some combination thereof. In various embodiments, network interface 1010 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

Input/output devices 1012 may, in some embodiments, include one or more display terminals, keyboards, keypads, touchpads, scanning devices, voice or optical recognition devices, or any other devices suitable for entering or accessing data by one or more computer systems 1000. Multiple input/output devices 1012 may be present in computer system 1000 or may be distributed on various nodes of computer system 1000. In some embodiments, similar input/output devices may be separate from computer system 1000 and may interact with one or more nodes of computer system 1000 through a wired or wireless connection, such as over network interface 1010.

Those skilled in the art will appreciate that computer system 1000 is merely illustrative and is not intended to limit the scope of embodiments. In particular, the computer system and devices may include any combination of hardware or software that can perform the indicated functions, including computers, network devices, Internet appliances, PDAs, wireless phones, pagers, etc. Computer system 1000 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 800 may be transmitted to computer system 800 via transmission media or signals such as electrical, electromagnetic, or digital signals, conveyed via a communication medium such as a network and/or a wireless link. Various embodiments may further include receiving, sending or storing instructions and/or data implemented in accordance with the foregoing description upon a computer-accessible medium. Generally speaking, a computer-accessible medium may include a non-transitory, computer-readable storage medium or memory medium such as magnetic or optical media, e.g., disk or DVD/CD-ROM, volatile or non-volatile media such as RAM (e.g. SDRAM, DDR, RDRAM, SRAM, etc.), ROM, etc. In some embodiments, a computer-accessible medium may include transmission media or signals such as electrical, electromagnetic, or digital signals, conveyed via a communication medium such as network and/or a wireless link.

The methods described herein may be implemented in software, hardware, or a combination thereof, in different embodiments. In addition, the order of the blocks of the methods may be changed, and various elements may be added, reordered, combined, omitted, modified, etc. Various modifications and changes may be made as would be obvious to a person skilled in the art having the benefit of this disclosure. The various embodiments described herein are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete compo-
nents in the example configurations may be implemented as
a combined structure or component. These and other varia-
tions, modifications, additions, and improvements may fall
within the scope of embodiments as defined in the claims
that follow.

What is claimed is:

1. An image sensor, comprising:
a pixel array of a plurality of pixels, wherein individual
    ones of the pixels include:
    (a) a photodiode that generates electrical current in
        response to an exposure of light,
    (b) a first floating diffusion (FD1) node that collects a
        first type of charge carrier of the electrical current,
        and
    (c) a second floating diffusion (FD2) node that collects
        a second type of charge carrier of the electrical
        current, wherein the second type of charge carrier is
        different from the first type of charge carrier;
a first readout circuitry of the pixel that outputs a first
    readout value of the FD1 node that is linear with respect
    to an amount of the electrical current generated in the
    photodiode; and
a second readout circuitry of the pixel that outputs a
    second readout value of the FD2 node that is logarith-
    mic with respect to the amount of the electrical current
    generated in the photodiode;
wherein the second readout value is used to generate
    image data corresponding to the exposure when the first
    signal exceeds a saturation threshold.

2. The image sensor of claim 1, wherein:
the FD1 node collects electrons; and
the FD2 node collects holes.

3. The image sensor of claim 1, wherein:
the pixels are electrically isolated using full-size deep
    trench isolation (FDTI).

4. The image sensor of claim 3, wherein:
the FDTI is implemented using polysilicon trenches; and
the polysilicon trenches are biased to control carrier flow
    to the FD2 node.

5. The image sensor of claim 1, wherein:
the FD2 node includes a p-type doped semiconductor
    region of the photodiode that collects holes generated
    by the photodiode when the photodiode is in a floating
    state.

6. The image sensor of claim 1, wherein:
the first readout circuitry includes a first transfer gate that
    controls when charge carriers from a p-type doping
    well are transferred to the FD1 node; and
the second readout circuitry does not employ a transfer
    gate for the FD2 node.

7. The image sensor of claim 1, wherein:
the second readout circuitry includes a reset transistor
    controllable to:
    allow a leakage current from the FD2 node to measure
        an accumulated charge in the FD2 node; and
    in response to a reset signal, pull the FD2 node to a
        ground voltage to discharge the FD2 node.

8. The image sensor of claim 1, configured to:
obtain two readout values from the FD2 node, including
    a first value before a reset of the FD2 node and a second
    value after the reset; and
determine a pixel value of the pixel based on a difference
    between the first and second values.

9. The image sensor of claim 1, wherein:
the pixel array is implemented on a first substrate; and the second readout circuitry is implemented on a second
    substrate distinct from the first substrate.

10. The image sensor of claim 1, configured to:
select between a first pixel value determined using the
    FD1 node and a second pixel value determined using
    the FD2 node to use to generate the image data.

11. The image sensor of claim 1, configured to:
determine that the exposure received by the pixel is in a
    specified range, and in response, combine pixel values
    determined from the FD1 node and the FD2 node to use
    to generate the image data.

12. The image sensor of claim 1, wherein different pixels
in the pixel array have different saturation thresholds.

13. A camera device, comprising:
a lens;
an image sensor comprising:
    a pixel array of a plurality of pixels, wherein individual
        ones of the pixels include:
        (a) a photodiode that generates electrical current in
            response to an exposure of light received through
            the lens,
        (b) a first floating diffusion (FD1) node that collects
            a first type of charge carrier of the electrical
            current, and
        (c) a second floating diffusion (FD2) node that
            collects a second type of charge carrier of the
            electrical current, wherein the second type of
            charge carrier is different from the first type of
            charge carrier;
    a first readout circuitry of the pixel that outputs a first
        readout value of the FD1 node that is linear with
        respect to an amount of the electrical current gener-
        ated in the photodiode; and
    a second readout circuitry of the pixel that outputs a
        second a second readout value of the FD2 node that
        is logarithmic with respect to the amount of the
        electrical current generated in the photodiode; and
an image signal processor configured to:
    use the second readout value to generate image data
        corresponding to the exposure when the first signal
        exceeds a saturation threshold.

14. The camera device of claim 13, wherein:
the camera device is a mobile device; and
the camera device is a video camera configured to capture
    video data.

15. A method, comprising:
receiving an exposure of light at a pixel array of pixels;
generating, in response to the exposure, an electrical
    current in a photodiode of one of the pixels;
collecting a first type of charge carrier of the electrical
    current at a first floating diffusion (FD1) node of the
    pixel;
collecting a second type of charge carrier of the electrical
    current at a second floating diffusion (FD2) node of the
    pixel, wherein the second type of charge carrier is
    different from the first type of charge carrier;
outputting, via a first readout circuitry of the pixel, a first
    readout value of the FD1 node that is linear with respect
    to an amount of the electrical current generated in the
    photodiode;
outputting, via a second readout circuitry of the pixel, a
    second readout value of the FD2 node that is logarith-
    mic with respect to the amount of the electrical current
    generated in the photodiode; and
selecting, based on a saturation threshold, a first pixel
    value determined using the first readout value or a second pixel value determined using the second readout value to generate image data corresponding to the exposure.

16. The method of claim 15, further comprising:
obtaining two readout values from the FD2 node, including a first value before a reset of the FD2 node and a second value after the reset; and
determining the second pixel value based on a difference between the first and second values.

17. The method of claim 15, further comprising the image sensor:
using a reset transistor of the second readout circuitry to control operation of the second readout circuitry, including:
allowing a leakage current from the FD2 node to measure an accumulated charge in the FD2 node; and
pulling the FD2 node to a ground voltage to reset the FD2 node.

18. The method of claim 15, wherein:
the first and second readout circuitry are implemented on an image sensor integrated circuit device; and
the selecting of the first pixel value or the second pixel value to use to generate the image data is performed at an image processor distinct from the image sensor integrated circuit device.

19. The method of claim 15, further comprising:
determining that another exposure received by the pixel is in a specified range, and in response, combining pixel values determined from the FD1 node and the FD2 node to generate image data corresponding to the other exposure.

20. The method of claim 15, further comprising:
performing a calibration of the pixel, including:
obtaining a linear readout value of the pixel via the first readout circuitry corresponding to a test exposure, wherein the linear readout value is linear with respect to an amount of the electron current generated in the photodiode in response to the test exposure;
obtaining a logarithmic readout value of the pixel via the second readout circuitry corresponding to the test exposure, wherein the logarithmic readout value is logarithmic with respect to the amount of hole current generated in the photodiode in response to the test exposure;
calculating one or more calibration values for the second readout circuitry based on multiple pairs of linear and logarithmic readout values obtained from multiple test exposures, wherein the calculation solves for the one or more calibration values assuming that the amount of hole current is equal to the amount of electron current for individual test exposures; and
saving the one or more calibration values to a persistent storage, wherein the one or more calibration values are used to adjust subsequent readout values from the second readout circuitry after the calibration.

* * * * *